(12) United States Patent
Tsai et al.

(10) Patent No.: US 9,917,079 B2
(45) Date of Patent: Mar. 13, 2018

(54) ELECTROSTATIC DISCHARGE PROTECTION CIRCUIT AND METHOD FOR RADIO FREQUENCY CIRCUIT

(71) Applicant: TAIWAN SEMICONDUCTOR MANUFACTURING COMPANY, LTD., Hsinchu (TW)

(72) Inventors: Ming Hsien Tsai, New Taipei (TW); Jen-Chou Tseng, Jhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 254 days.

(21) Appl. No.: 14/315,424

(22) Filed: Jun. 26, 2014

(65) Prior Publication Data
US 2014/0307355 A1    Oct. 16, 2014

Related U.S. Application Data

(63) Continuation-in-part of application No. 13/332,095, filed on Dec. 20, 2011, now Pat. No. 8,792,218.

(51) Int. Cl.
| | |
|---|---|
| *H01L 27/02* | (2006.01) |
| *H02H 9/04* | (2006.01) |
| *H03F 1/52* | (2006.01) |
| *H03F 3/195* | (2006.01) |

(52) U.S. Cl.
CPC ...... *H01L 27/0248* (2013.01); *H01L 27/0251* (2013.01); *H02H 9/046* (2013.01); *H03F 1/52* (2013.01); *H03F 3/195* (2013.01)

(58) Field of Classification Search
CPC ... H01L 27/0248; H01L 27/0251; H03F 1/52; H03F 3/195; H02H 9/046
See application file for complete search history.

(56) References Cited

U.S. PATENT DOCUMENTS

| | | | | |
|---|---|---|---|---|
| 5,774,318 A | * | 6/1998 | McClure | H01L 27/0259 361/111 |
| 6,885,534 B2 | | 4/2005 | Ker et al. | |
| 6,894,567 B2 | | 5/2005 | Vickram et al. | |

(Continued)

OTHER PUBLICATIONS

Huang, Bo-Jr, et al., "Design and Analysis for a 60-GHZ Low-Noise Amplifier with RF ESD Protection", IEEE Transactions on Microwave Theory and Techniques, vol. 57, No. 2, Feb. 2009, pp. 298-305.

*Primary Examiner* — Zeev V Kitov
(74) *Attorney, Agent, or Firm* — Hauptman Ham, LLP

(57) ABSTRACT

An ESD protection circuit for an RF circuit includes first and second power supply voltage terminals for first and second power supply voltages and a power clamp coupled between the terminals. An RF input pad is configured to receive an input signal having an RF operating frequency. A resonance circuit is coupled to the RF input pad. A first ESD current path from the RF input pad to the first power supply voltage terminal includes the resonance circuit and a first ESD block configured to direct an ESD pulse of a first polarity toward the first terminal. A second ESD current path from the RF input pad to the second power supply voltage terminal includes the resonance circuit and a second ESD block configured to direct an ESD pulse of a second polarity toward the second terminal.

20 Claims, 11 Drawing Sheets

(56) References Cited

U.S. PATENT DOCUMENTS

| | | |
|---|---|---|
| 7,009,826 B2 | 3/2006 | Ker et al. |
| 7,023,677 B2 | 4/2006 | Ker et al. |
| 7,023,678 B2 | 4/2006 | Ker et al. |
| 7,224,949 B2 | 5/2007 | Kluge et al. |
| 7,477,495 B2 * | 1/2009 | Dornbusch ......... H01L 27/0251 331/117 FE |
| 2002/0163768 A1 * | 11/2002 | Kwon ................. H01L 27/0255 361/56 |
| 2005/0082566 A1 * | 4/2005 | Menard ............... H01L 29/7412 257/119 |
| 2009/0195946 A1 * | 8/2009 | Kleveland ........... H01L 27/0251 361/56 |
| 2010/0245039 A1 * | 9/2010 | Tokunaga ........... G07C 9/00309 340/5.61 |
| 2012/0019968 A1 * | 1/2012 | Hsieh ....................... H03F 1/52 361/56 |
| 2012/0043930 A1 * | 2/2012 | Scudiere ................ H01F 38/14 320/108 |

* cited by examiner

ELECTROSTATIC DISCHARGE PROTECTION CIRCUIT AND METHOD FOR RADIO FREQUENCY CIRCUIT

PRIORITY CLAIM

The present application is a continuation-in-part of U.S. application Ser. No. 13/332,095, filed Dec. 20, 2011, which is entirely incorporated by reference herein.

BACKGROUND

The recent trend in miniaturizing integrated circuits (ICs) has resulted in smaller devices which consume less power, yet provide more functionally at higher speeds than before. The miniaturization process has also increased the devices' susceptibility to electrostatic discharge (ESD) events due to various factors, such as thinner dielectric thicknesses and associated lowered dielectric breakdown voltages. ESD is one of the causes of electronic circuit damage and is also one of the considerations in semiconductor advanced technology.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
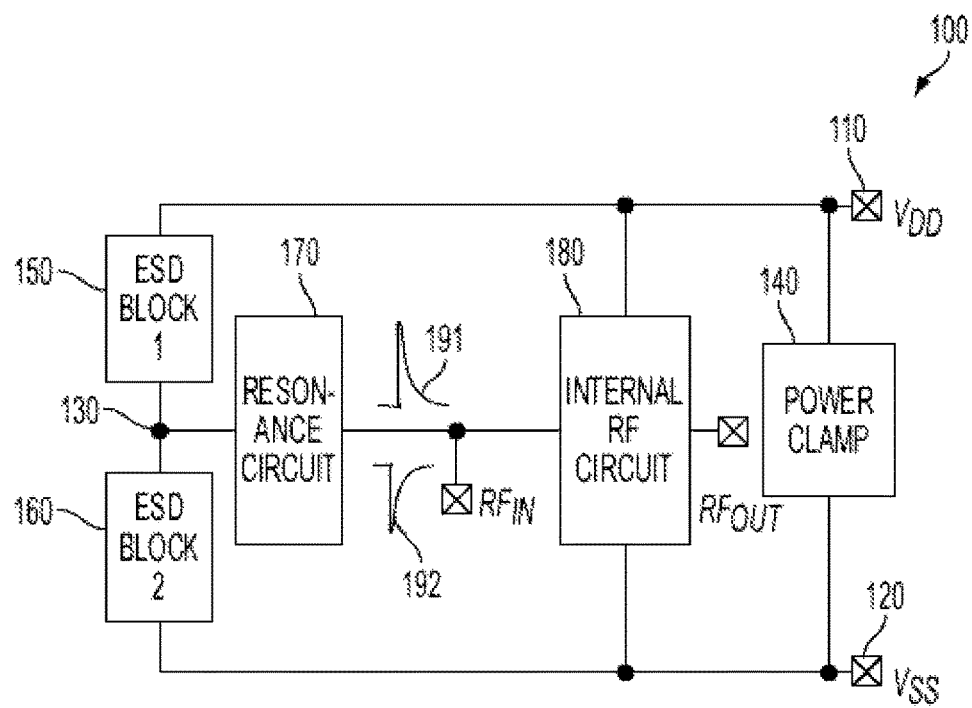
FIG. 1 is a schematic block diagram of an ESD protection circuit in accordance with some embodiments.

It is to be understood that the following disclosure provides many different embodiments or examples, for implementing different features of various embodiments. Specific examples of components and arrangements are described below to simplify the present disclosure. The inventive concept may, however, be embodied in many different forms and should not be construed as being limited to the embodiments set forth herein; rather, these embodiments are provided so that this description will be thorough and complete, and will fully convey the inventive concept to those of ordinary skill in the art. It will be apparent, however, that one or more embodiments may be practiced without these specific details.

The drawings are not drawn to scale, and include certain features that are exaggerated for clarity. Like reference numerals in the drawings denote like elements. The elements and regions illustrated in the figures are schematic in nature, and thus relative sizes or intervals illustrated in the figures are not intended to limit the scope of the inventive concept.

FIG. 1 is a schematic block diagram of an ESD protection circuit 100 in accordance with some embodiments. The ESD protection circuit 100 includes a first power supply voltage terminal 110, a second power supply voltage terminal 120, and an intermediate node 130. The ESD protection circuit 100 further includes a power clamp 140, first and second ESD blocks 150, 160, and a resonance circuit 170.

The ESD protection circuit 100 is arranged to protect an internal radio frequency (RF) circuit 180 from ESD events. The ESD protection circuit 100 and the RF circuit 180 together define an RF semiconductor device. In some embodiments, the ESD protection circuit 100 and RF circuit 180 are incorporated in a single IC, or on a single substrate. In some embodiments, the RF circuit 180 includes one or more semiconductor components. In some embodiments, the RF circuit 180 includes one or more complementary metal-oxide-semiconductor (CMOS) components. The RF circuit 180 is configured to receive, process and/or output RF signals. In some embodiments, the RF operating frequency at which the RF circuit 180 is configured to operate is in the GHz spectrum and higher. In some embodiments, the RF operating frequency of the RF circuit 180 is 60 GHz and up to the THz spectrum. In some embodiments, the RF circuit 180 includes an RF millimeter-wave front-end circuit.

The RF circuit 180 is coupled to the first power supply voltage terminal 110 and second power supply voltage terminal 120, and includes an RF input pad $RF_{in}$. In some embodiments, the RF circuit 180 further includes an RF output pad $RF_{out}$. The RF input pad $RF_{in}$ is arranged to receive an RF input signal having an RF operating frequency at which the RF circuit 180 is configured to operate. During ESD events, ESD pulses of different polarities are applied to the RF input pad $RF_{in}$. Without the ESD protection circuit 100, such ESD events cause excessive and potentially damaging voltages or currents in the RF circuit 180.

The first power supply voltage terminal 110 is configured to receive a first power supply voltage for the RF circuit 180, and the second power supply voltage terminal is configured to receive a second power supply voltage for the RF circuit 180. In some embodiments, the first power supply voltage is a positive power supply voltage VDD, and the second power supply voltage is a ground voltage. Other power supply arrangements are within the scope of this disclosure.

The power clamp 140 is coupled between the first and second power supply voltage terminals 110, 120. The power clamp 140 is a normally nonconductive device which is nonconductive during normal operation of the RF circuit 180. Specifically, the power clamp 140 is nonconductive if the voltage difference between the first power supply voltage terminal 110 and the second power supply voltage terminal 120 is within a predetermined range, e.g., around (VDD-VSS). When the voltage difference across the power clamp 140 is greater than a threshold voltage of the power clamp 140, the power clamp 140 is opened to conduct the current from the first power supply voltage terminal 110 to the second power supply voltage terminal 120.

The first ESD block 150 is coupled between the intermediate node 130 and the first power supply voltage terminal 110. The first ESD block 150 is configured to direct an ESD pulse of a first polarity toward the first power supply voltage terminal 110 during an ESD event. The second ESD block 160 is coupled between the intermediate node 130 and the second power supply voltage terminal 120. The second ESD block 160 is configured to direct an ESD pulse of a second, opposite polarity toward the second power supply voltage terminal 120.

For example, when a positive ESD pulse 191 occurs at the RF input pad $RF_{in}$ and has a voltage higher than VDD, the first ESD block 150 conducts to thereby divert an ESD current caused by the positive ESD pulse 191 away from the RF circuit 180. Specifically, the ESD current flows from the RF input pad $RF_{in}$, via the intermediate node 130, to the first power supply voltage terminal 110. The ESD current causes a voltage surge on the first power supply voltage terminal 110 and, as a result, an excess voltage difference occurs across the power clamp 140. If the excess voltage difference is greater than the threshold voltage of the power clamp 140, the power clamp 140 conducts the ESD current from the first power supply voltage terminal 110 to the second power supply voltage terminal 120, thereby preventing the voltage surge on the first power supply voltage terminal 110 from damaging circuitry of the RF circuit 180.

If a negative ESD pulse 192 occurs at the RF input pad $RF_{in}$ and has a lower voltage than VSS, the second ESD block 160 conducts to divert an ESD current caused by the negative ESD pulse 192 away from the RF circuit 180. Specifically, the ESD current flows from the RF input pad $RF_{in}$, via the intermediate node 130, to the second power supply voltage terminal 120. The ESD current causes a voltage drop on the second power supply voltage terminal 120 and, as a result, an excess voltage difference occurs across the power clamp 140. If the excess voltage difference is greater than the threshold voltage of the power clamp 140, the power clamp 140 conducts current from the first power supply voltage terminal 110 to the second power supply voltage terminal 120, thereby preventing the voltage drop on the second power supply voltage terminal 120 from damaging circuitry of the RF circuit 180.

As a result of the protection action of the ESD protection circuit 100, ESD events occurring at the RF input pad $RF_{in}$ are unlikely to cause excess voltages to be applied to the circuitry of the RF circuit 180, thereby avoiding dielectric breakdown in various semiconductor devices of the RF circuit 180.

Several components of the ESD protection circuit 100, while useful for ESD protection purposes, are isolated from RF input signals at the RF input pad $RF_{in}$ during normal operation of the RF circuit 180. For example, the first ESD block 150 and/or second ESD block 160 include one or more elements, such as diodes, which have parasitic capacitance. At certain RF operating frequencies, such parasitic capacitance, if not isolated from the RF input pad $RF_{in}$, begins to affect RF performance of the RF circuit 180.

The resonance circuit 170 is included in the ESD protection circuit 100 for isolating the parasitic capacitance from the RF input pad $RF_{in}$ during normal operation of the RF circuit 180. The resonance circuit 170 is coupled between the RF input pad $RF_{in}$ and the intermediate node 130 and is common to both the first ESD block 150 and the second ESD block 160. The resonance circuit 170 is configured to present various impedances to signals of various frequencies. Specifically, the resonance circuit 170 presents a greater impedance to signals of RF frequencies than to ESD pulses of much lower frequencies. Thus, during normal operation of the RF circuit 180, the resonance circuit 170 presents a large impedance to the RF input signal applied to the RF input pad $RF_{in}$. As a result, the first ESD block 150 and second ESD block 160, as well as their parasitic capacitance, are isolated from the RF input pad $RF_{in}$ by the large impedance of the resonance circuit 170 during normal operation of the RF circuit 180. During an ESD event, the resonance circuit 170 exhibits a much lower impedance to an ESD pulse at the RF input pad $RF_{in}$, and permits the ESD pulse to be conducted through to the intermediate node 130 and then to either the first power supply voltage terminal 110 or the second power supply voltage terminal 120 depending on the ESD pulse polarity. Functionality of both the ESD protection circuit 100 and the RF circuit 180 during ESD events and normal RF operation is therefore ensured.

In some embodiments, the resonance circuit 170 has a resonance frequency that matches an RF operating frequency of the RF circuit 180, or an RF operating frequency of the RF input signal applied to the RF circuit 180. The resonance frequency is considered to match the RF operating frequency if the resonance frequency is in a range from 80% to 120% of the RF operating frequency. In some embodiments, the resonance frequency is in a range from 90% to 110% of the RF operating frequency. In some embodiments, the resonance frequency is in a range from 95% to 105% of the RF operating frequency. With a resonance frequency that matches the RF operating frequency, the resonance circuit 170 is at or near resonance when an RF input signal of the RF operating frequency is applied to the RF input pad $RF_{in}$. The resonance circuit 170 then exhibits a very large, theoretically infinite, impedance to the RF input signal at the RF input pad $RF_{in}$ and effectively isolates the RF input pad $RF_{in}$ from parasitic capacitance of the first ESD block 150 and/or second ESD block 160 behind the resonance circuit 170. At a much lower frequency of an ESD event, the impedance of the resonance circuit 170 is very low, and ESD currents are permitted to flow through the resonance circuit 170 to other components of the ESD protection circuit 100. By including a common resonance circuit 170 for shielding both the first ESD block 150 and the second ESD block 160 from RF input signals, the circuit complexity and manufacture costs are reduced.

Figure 2:
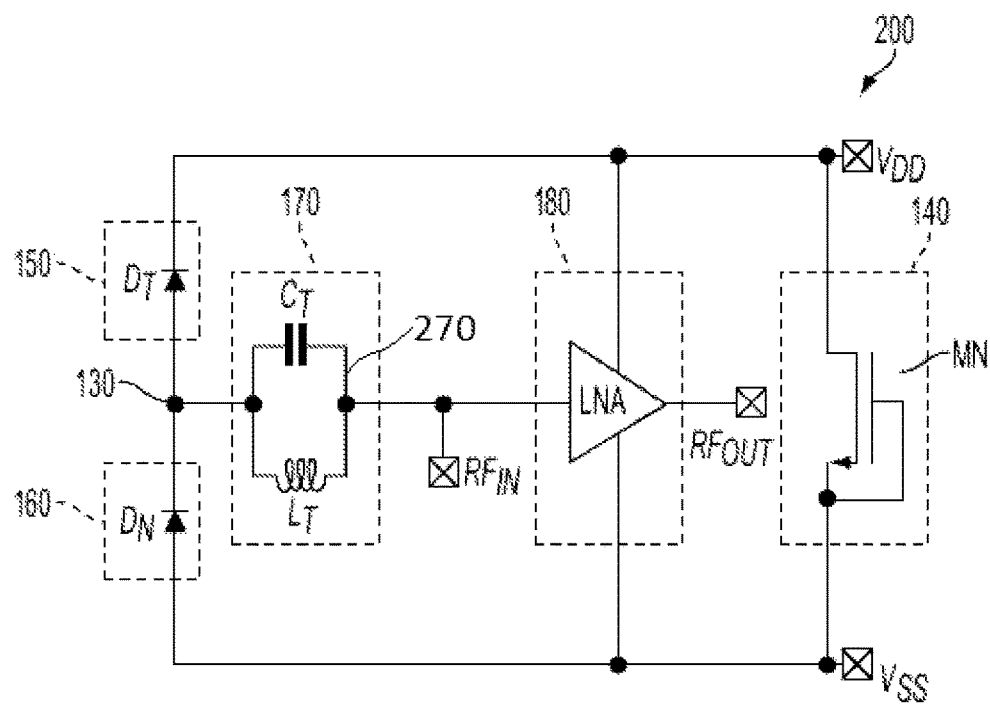
FIG. 2 is a schematic circuit diagram of an ESD protection circuit in accordance with some embodiments.

FIG. 2 is a schematic circuit diagram of an ESD protection circuit 200 in accordance with some embodiments. The ESD protection circuit 200 includes a diode $D_T$ which functions as the first ESD block 150, a diode $D_B$ which functions as the second ESD block 160, a gate-grounded n-channel metal-oxide semiconductor (NMOS) transistor MN which functions as the power clamp 140, and an LC resonance circuit 270 which functions as the resonance circuit 170.

The RF circuit 180 to be protected by the ESD protection circuit 200 is a low noise amplifier (LNA). In some embodiments, the LNA is coupled to the outside (e.g., via the RF output pad $RF_{out}$) by an antenna and is often exposed to ESD events. Other RF circuits are usable in some embodiments.

The diode $D_T$ has an anode coupled to the intermediate node 130 and a cathode coupled to the power supply voltage terminal VDD. The diode $D_B$ has an anode coupled to the ground voltage terminal VSS and a cathode coupled to the intermediate node 130. In some embodiments, other ESD block configurations are usable for the first ESD block 150 and/or the second ESD block 160 instead of one or both of the diode $D_T$ and diode $D_B$.

The NMOS transistor MN has a drain coupled to a power supply voltage terminal VDD, and a source and a gate commonly coupled to a ground voltage terminal VSS. During normal operation of the LNA without a voltage surge or drop on the power supply voltage terminal VDD or ground voltage terminal VSS, the NMOS transistor MN remains in the OFF state, because its gate-to-source voltage (zero) is less than a threshold voltage of the NMOS transistor MN. During an ESD event with a voltage surge on the power supply voltage terminal VDD, the voltage difference across the NMOS transistor MN exceeds a threshold value and the NMOS transistor MN undergoes snapback where the source, drain, and substrate of the NMOS transistor MN form a forward biased N-P-N bipolar junction transistor which conducts current from power supply voltage terminal VDD to ground voltage terminal VSS, thereby preventing the voltage surge from affecting the LNA. A similar snapback operation takes place when an excess voltage drop occurs on the ground voltage terminal VSS. In some embodiments, other power clamp configurations are usable instead of the NMOS transistor MN.

The LC resonance circuit 270 includes an inductor $L_T$ and an element that exhibits a capacitive characteristic at the RF operating frequency. In the particular embodiment of the ESD protection circuit 200, the element is a capacitor $C_T$. The inductor $L_T$ and capacitor $C_T$ are coupled in parallel between the RF input pad $RF_{in}$ and the intermediate node 130. In some embodiments, the LC resonance circuit 270 includes a resistor and functions as an RLC resonance circuit. In some embodiments, any connections among the inductor $L_T$, the capacitor $C_T$, any resistor included in the LC resonance circuit 270, the RF input pad $RF_{in}$ and the intermediate node 130 are usable, provided that the LC resonance circuit 270 has a resonance frequency that matches the RF operating frequency of the LNA.

During normal operation of the LNA, RF input signals at the RF input pad $RF_{in}$ are isolated from the diode $D_T$ and diode $D_B$ (and also from the diodes' parasitic capacitance) by the LC resonance circuit 270 as described with respect to the resonance circuit 170. When an ESD event occurs, the ESD current which has a much lower frequency than the RF operating frequency is transmitted through the inductor $L_T$ in the LC resonance circuit 270, to the intermediate node 130, and then either though the diode $D_T$ or the diode $D_B$ depending on the polarity of the ESD event.

In some embodiments, the inductor $L_T$ is the only inductor in the whole ESD protection circuit 200. In some embodiments, the inductor $L_T$ is the only inductor in both a first ESD current path from the RF input pad $RF_{in}$ to the intermediate node 130 and then to the power supply voltage terminal VDD, and a second ESD current path from the RF input pad $RF_{in}$ to the intermediate node 130 and then to the ground voltage terminal VSS. By including a single inductor, which often occupies a die area comparable to hundreds of other semiconductor components, the manufacturing and area costs of the ESD protection circuit 200 are reduced.

FIGS. 3A-3G are schematic circuit diagrams of various ESD protection circuits in accordance with some embodiments.

Figure 3A:
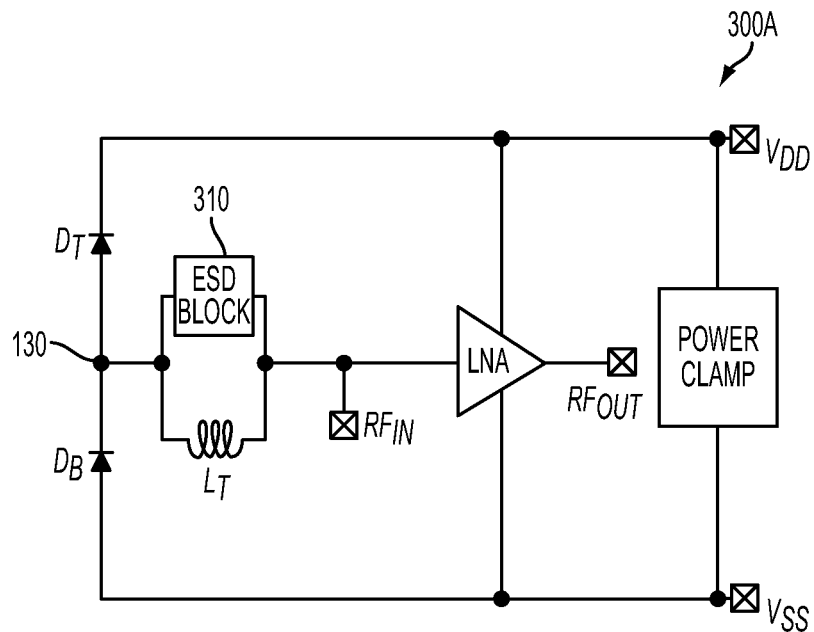
FIGS. 3A-3G are schematic circuit diagrams of various ESD protection circuits in accordance with some embodiments.

An ESD protection circuit 300A in FIG. 3A is similar to the ESD protection circuit 200, except that the capacitor $C_T$ of the ESD protection circuit 200 is replaced by an ESD block 310 which is coupled in parallel with the inductor $L_T$. As discussed with respect to the first ESD block 150 and the second ESD block 160, an ESD block, such as the ESD block 310, has parasitic capacitance which, under certain circumstances, becomes significant at the RF operating frequency of the LNA. By tuning the inductor $L_T$ based on the parasitic capacitance of the ESD block 310, a resonance frequency that matches the RF operating frequency of the LNA is achieved. As a result, the parasitic capacitance of the ESD block 310 is used, in combination with the inductor $L_T$, to isolate parasitic capacitance of the diode $D_T$ and diode $D_B$ from RF input signals during normal operation of the LNA. During an ESD event, the ESD block 310 performs the ESD protection function and conducts, in addition to the inductor $L_T$, the ESD current toward the diode $D_T$ and/or the diode $D_B$. Thus, multiple ESD current paths are provided which improves the ESD performance.

Figure 3B:
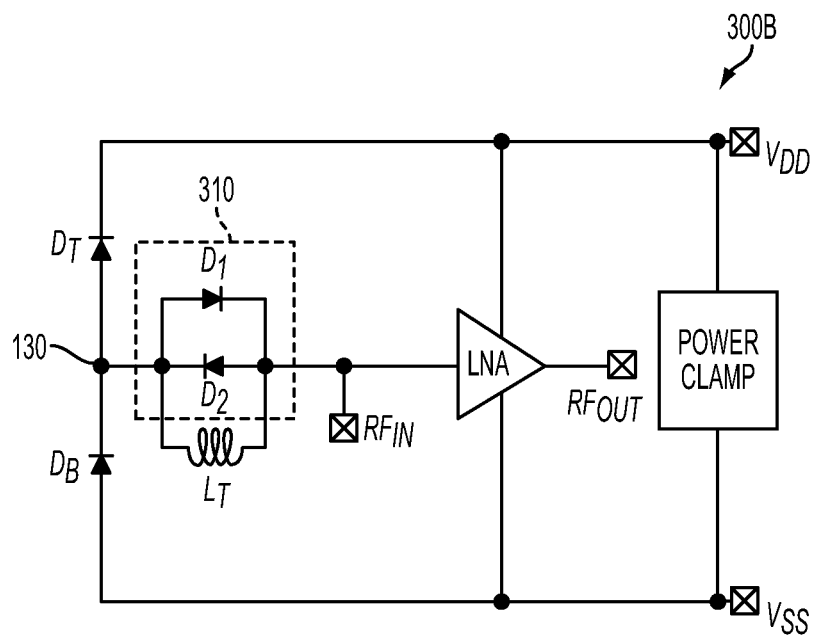
Figure 3C:
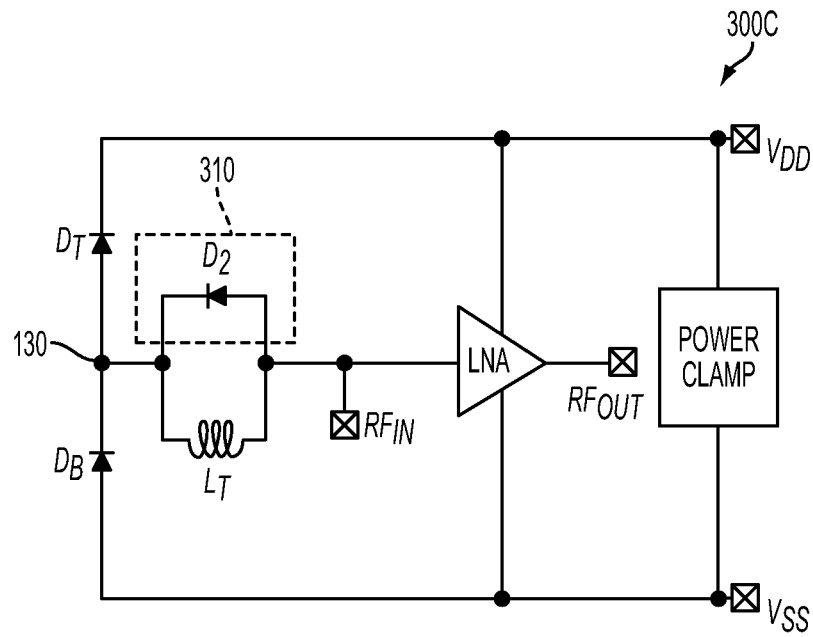
Figure 3D:
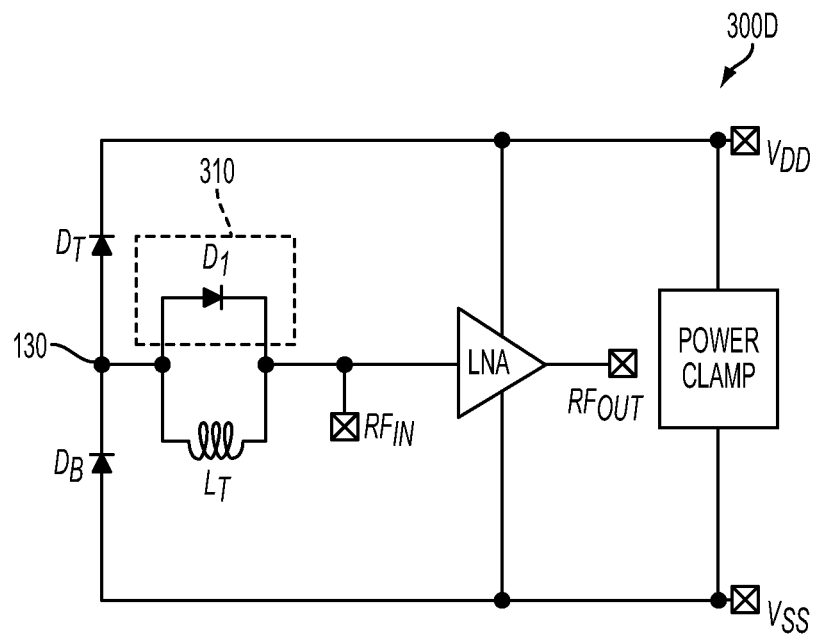

ESD protection circuits 300B, 300C, 300D in FIGS. 3B, 3C, 3D realize the ESD block 310 of the ESD protection circuit 300A by at least one diode. Specifically, the ESD protection circuit 300B in FIG. 3B realizes the ESD block 310 of the ESD protection circuit 300A by a pair of diode $D_1$ and diode $D_2$ both of which are coupled in parallel with the inductor $L_T$. The diode $D_1$ has an anode coupled to the intermediate node 130 and a cathode coupled to the RF input pad $RF_{in}$. The diode $D_2$ has an anode coupled to the RF input pad $RF_{in}$ and a cathode coupled to the intermediate node 130. By tuning the inductor $L_T$ based on the parasitic capacitance of both the diode $D_1$ and diode $D_2$, a resonance frequency that matches the RF operating frequency of the LNA is achieved. As a result, the parasitic capacitance of the diode $D_1$ and diode $D_2$ is used, in combination with the inductor $L_T$, to isolate parasitic capacitance of the diode $D_T$ and diode $D_B$ from RF input signals during normal operation of the LNA. During a positive ESD event, the diode $D_2$ conducts, in addition to the inductor $L_T$, the ESD current toward the diode $D_T$ and then to the power supply voltage terminal VDD. During a negative ESD event, the diode $D_1$ conducts, in addition to the inductor $L_T$, the ESD current toward the diode $D_B$ and then to the ground voltage terminal VSS. Thus, multiple ESD current paths are provided which improves the ESD performance.

The ESD protection circuit 300C in FIG. 3C realizes the ESD block 310 of the ESD protection circuit 300A by one diode $D_2$ coupled in parallel with the inductor $L_T$. By tuning the inductor $L_T$ based on the parasitic capacitance of the diode $D_2$, a resonance frequency that matches the RF operating frequency of the LNA is achieved. As a result, the parasitic capacitance of the diode $D_2$ is used, in combination with the inductor $L_T$, to isolate parasitic capacitance of the diode $D_T$ and diode $D_B$ from RF input signals during normal operation of the LNA. During a positive ESD event, the diode $D_2$ conducts, in addition to the inductor $L_T$, the ESD current toward the diode $D_T$ and then to the power supply voltage terminal VDD. During a negative ESD event, the ESD current is conducted by the inductor $L_T$ toward the diode $D_B$ and then to the ground voltage terminal VSS. Thus, multiple ESD current paths are provided which improves ESD performance.

The ESD protection circuit 300D in FIG. 3D realizes the ESD block 310 of the ESD protection circuit 300A by one diode $D_1$ coupled in parallel with the inductor $L_T$. By tuning the inductor $L_T$ based on the parasitic capacitance of the diode $D_1$, a resonance frequency that matches the RF operating frequency of the LNA is achieved. As a result, the parasitic capacitance of the diode $D_1$ is used, in combination with the inductor $L_T$, to isolate parasitic capacitance of the diode $D_T$ and diode $D_B$ from RF input signals during normal operation of the LNA. During a positive ESD event, the ESD current is conducted by the inductor $L_T$ toward the diode $D_T$ and then to the power supply voltage terminal VDD. During a negative ESD event, the ESD current is conducted by the diode $D_1$, in addition to the inductor $L_T$, toward the diode $D_B$ and then to the ground voltage terminal VSS. Thus, multiple ESD current paths are provided which improves the ESD performance.

Figure 3E:
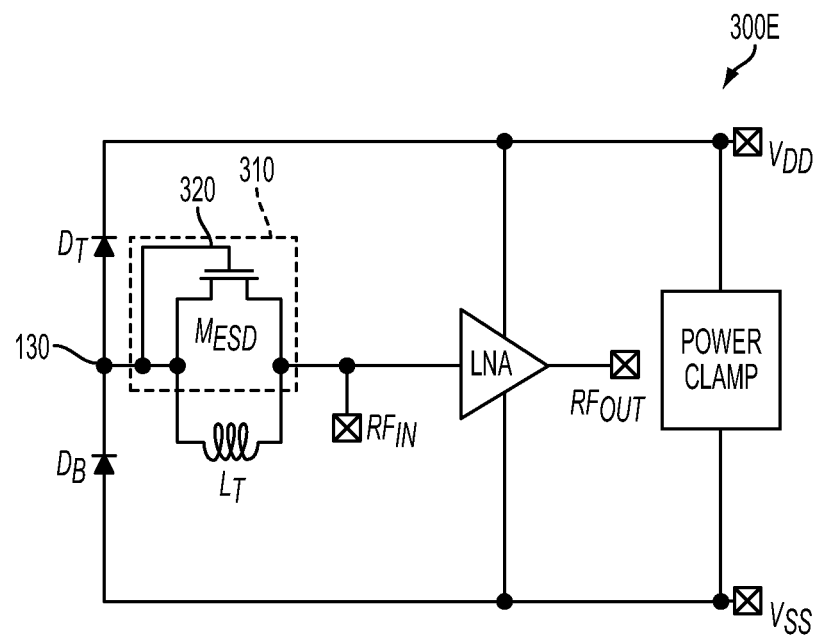

An ESD protection circuit 300E in FIG. 3E realizes the ESD block 310 of the ESD protection circuit 300A by an NMOS transistor 320. The NMOS transistor 320 has a source and a gate commonly coupled to the intermediate node 130, and a drain coupled to the RF input pad $RF_{in}$. The NMOS transistor 320 is configured and operates similarly to the gate-grounded NMOS transistor MN described with respect to FIG. 2. Specifically, the NMOS transistor 320 is normally nonconductive, and becomes conductive during an ESD event. By tuning the inductor $L_T$ based on the parasitic capacitance of the NMOS transistor 320, a resonance frequency that matches the RF operating frequency of the LNA is achieved. As a result, the parasitic capacitance of the NMOS transistor 320 is used, in combination with the inductor $L_T$, to isolate parasitic capacitance of the diode $D_T$ and diode $D_B$ from RF input signals during normal operation of the LNA. During an ESD event, the NMOS transistor 320 becomes conductive and conducts, in addition to the inductor $L_T$, the ESD current toward the diode $D_B$ and/or diode $D_T$. Thus, multiple ESD current paths are provided which improves the ESD performance.

Figure 3F:
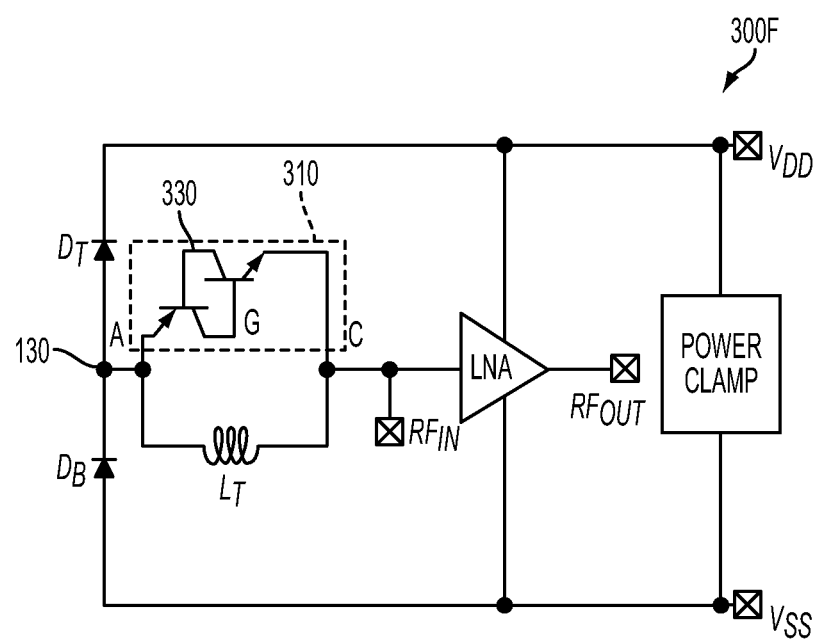

An ESD protection circuit 300F in FIG. 3F realizes the ESD block 310 of the ESD protection circuit 300A by a silicon-controlled rectifier (SCR) 330. The SCR 330 has an anode A coupled to the intermediate node 130, and a cathode C coupled to the RF input pad $RF_{in}$. A control gate G of the SCR 330 is floating. The SCR 330 operates similarly to the gate-grounded NMOS transistor MN described with respect to FIG. 2. Specifically, the SCR 330 is normally nonconductive, and snapbacks to become conductive during an ESD event. By tuning the inductor $L_T$ based on the parasitic capacitance of the SCR 330, a resonance frequency that matches the RF operating frequency of the LNA is achieved. As a result, the parasitic capacitance of the SCR 330 is used, in combination with the inductor $L_T$, to isolate parasitic capacitance of the diode $D_T$ and diode $D_B$ from RF input signals during normal operation of the LNA. During an ESD event, the SCR 330 becomes conductive and conducts, in addition to the inductor $L_T$, the ESD current toward the diode $D_B$ and/or diode $D_T$. Thus, multiple ESD current paths are provided which improves the ESD performance.

Figure 3G:
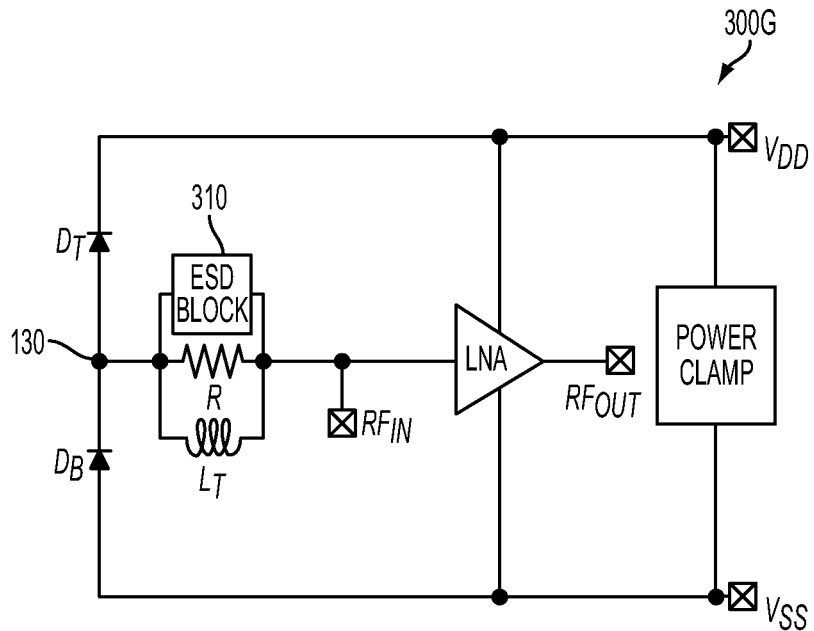

An ESD protection circuit 300G in FIG. 3G is similar to the ESD protection circuit 300A, except that a resistor R is coupled in parallel to the ESD block 310 and the inductor $L_T$. Specifically, the resistor R has a first end coupled to the RF input pad $RF_{in}$ and a second, opposite end coupled to the intermediate node 130. In some embodiments, a resistance value of the resistor R is in a range from a few ohms to a few megaohms. By tuning the inductor $L_T$ and/or the resistance value of the resistor R based on the parasitic capacitance of the ESD block 310, a resonance frequency that matches the RF operating frequency of the LNA is achieved. The presence of the resistor R permits easy tuning of the resonance frequency of the LC resonance circuit 270. The ESD protection circuit 300G operates similarly to the ESD protection circuit 300A, except that during an ESD event, the ESD current is conducted by not only the inductor $L_T$ but also the resistor R. Thus, multiple ESD current paths are provided which improves the ESD performance.

Figure 4:
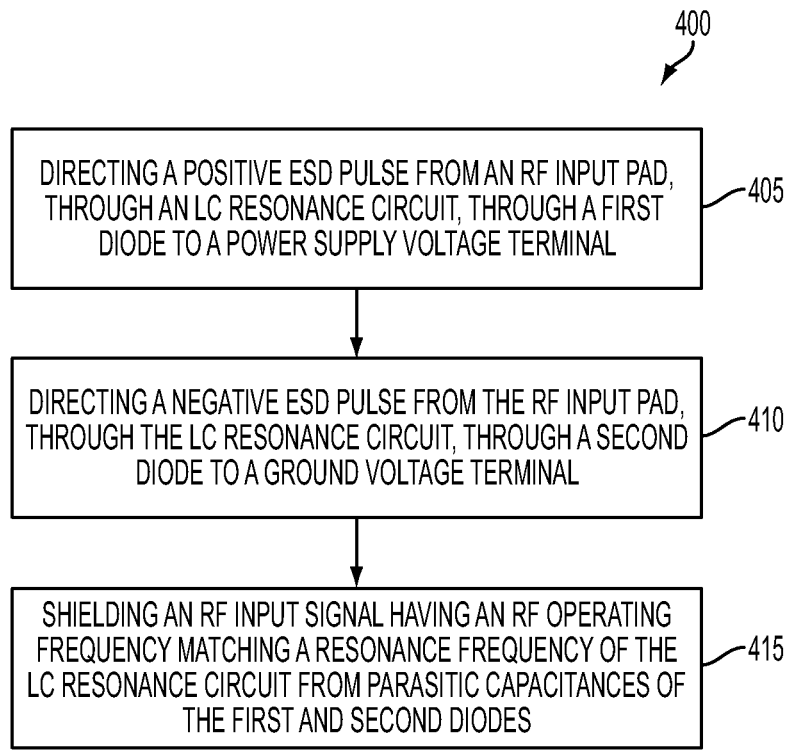
FIG. 4 is a flow chart of an ESD protection method in accordance with some embodiments.

FIG. 4 is a flow chart of an ESD protection method 400 in accordance with some embodiments. At step 405, upon occurrence of a first ESD pulse (e.g., 191) of a positive polarity at an RF input pad $RF_{in}$ of the RF semiconductor device, the first ESD pulse is transmitted along a first ESD current path from the RF input pad $RF_{in}$, through a resonance circuit (e.g., 170), to an intermediate node 130, then through a first diode (e.g., diode $D_T$) to a power supply voltage terminal VDD of the RF semiconductor device.

At step 410, upon occurrence of a second ESD pulse (e.g., 192) of a negative polarity at the RF input pad $RF_{in}$, the second ESD pulse is transmitted along a second ESD current path from the RF input pad $RF_{in}$, through the resonance circuit 170, to the intermediate node 130, then through a second diode (e.g., diode $D_B$) to a ground voltage terminal VSS of the RF semiconductor device. Thus, the resonance circuit 170 is common to both the first and second ESD current paths.

At step 415, upon application of an RF input signal, which has an RF operating frequency matching a resonance frequency of the resonance circuit 170, to the RF input pad $RF_{in}$, the resonance circuit 170 exhibits very large impedance to the RF input signal and shields the RF input signal and the RF input pad from parasitic capacitances of the first and second diodes. By using a common resonance circuit for isolating both first and second diodes from RF input signals, manufacture and area costs are reduced.

The above method embodiment shows exemplary steps, but they are not necessarily required to be performed in the order shown. Steps may be added, replaced, changed order, and/or eliminated as appropriate, in accordance with the spirit and scope of embodiments of the disclosure. Embodiments that combine different features and/or different embodiments are within scope of the disclosure and will be apparent to those skilled in the art after reviewing this disclosure.

FIGS. 5-9 are schematic circuit diagrams of various ESD protection circuits in accordance with some embodiments. Each of the various ESD protection circuits is similar to ESD protection circuit 100 of FIG. 1, in which a first ESD current path from RF input pad $RF_{in}$ to first power supply voltage terminal, or rail, 110 comprises resonance circuit 170 and ESD block 150, and a second ESD current path from RF input pad $RF_{in}$ to second power supply voltage terminal, or rail, 120 comprises resonance circuit 170 and ESD block 160.

Figure 5:
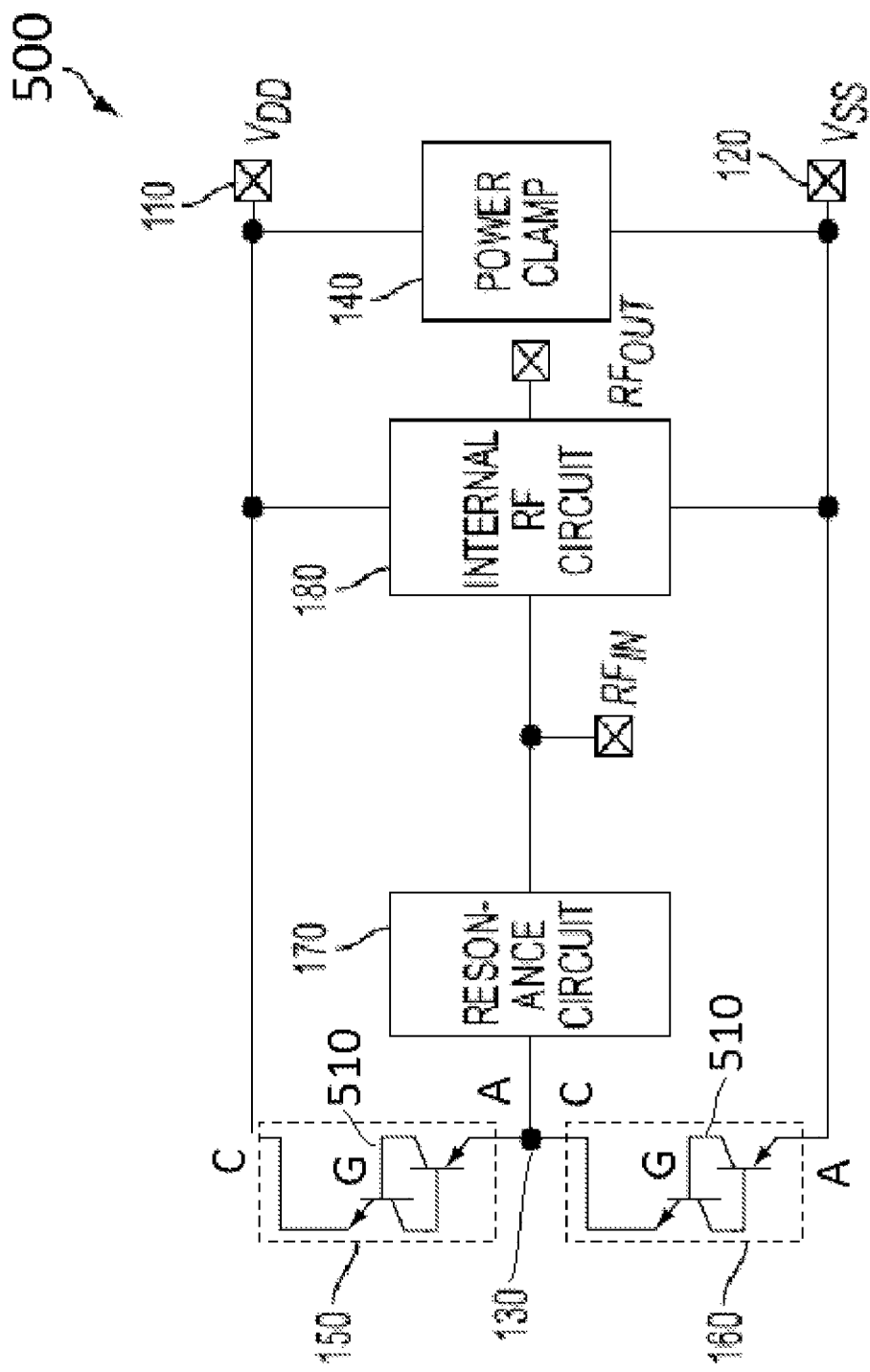
FIG. 5 is a schematic block diagram of an ESD protection circuit in accordance with some embodiments.

FIG. 5 is a schematic circuit diagram of an ESD protection circuit 500 in accordance with some embodiments. ESD protection circuit 500 includes silicon-controlled rectifier (SCR) 510 which functions as first ESD block 150 and/or second ESD block 160. SCR 510 has an anode A, a cathode C, and a control gate G. In embodiments in which SCR 510 functions as ESD block 150, anode A is coupled to resonance circuit 170, cathode C is coupled to first power supply voltage terminal, or rail, 110, and control gate G is floating. In embodiments in which SCR 510 functions as ESD block 160, anode A is coupled to second power supply voltage terminal, or rail, 120, cathode C is coupled to resonance circuit 170, and control gate G is floating. SCR 510 is similar to SCR 330, described with respect to FIG. 3F, and operates similarly to the gate-grounded NMOS transistor MN described with respect to FIG. 2. Specifically, SCR 510 is normally nonconductive, and snaps back to become conductive during an ESD event.

Figure 6:
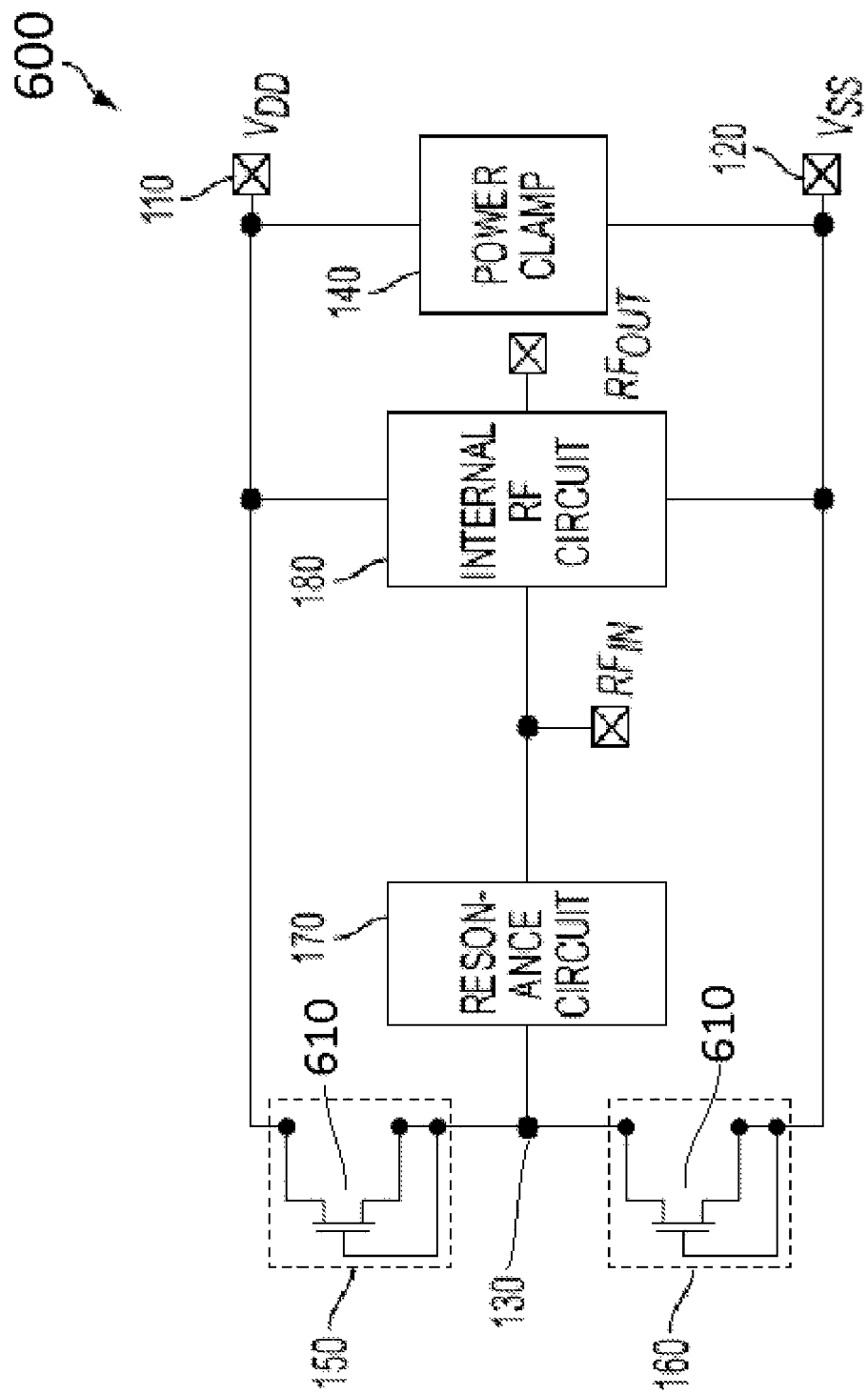
FIG. 6 is a schematic block diagram of an ESD protection circuit in accordance with some embodiments.

FIG. 6 is a schematic circuit diagram of an ESD protection circuit 600 in accordance with some embodiments. ESD protection circuit 600 includes bipolar junction transistor (BJT) circuit 610. In some embodiments, BJT circuit 610 comprises a gate-grounded NMOS transistor that is configured to operate as a forward biased NPN BJT in response to an ESD pulse. In various embodiments, BJT circuit 610 functions as first ESD block 150 and/or second ESD block 160. BJT circuit 610 operates similarly to the gate-grounded NMOS transistor MN described with respect to FIG. 2. Specifically, BJT circuit 610 is normally nonconductive, and snaps back to become conductive during an ESD event. In embodiments in which BJT circuit 610 functions as ESD block 150, the source and gate of the NMOS transistor are commonly coupled to the resonance circuit and the drain is coupled to first power supply voltage terminal, or rail, 110. In embodiments in which BJT circuit 610 functions as ESD block 160, the source and gate of the NMOS transistor are commonly coupled to second power supply voltage terminal, or rail, 120, and the drain is coupled to the resonance circuit.

During normal operation of internal RF circuit 180, the NMOS transistor of BJT circuit 610 remains in the OFF state because its gate-to-source voltage (zero) is less than a threshold voltage of the NMOS transistor. During an ESD pulse, the voltage difference across the NMOS transistor of BJT circuit 610 exceeds a threshold value and the NMOS transistor undergoes snapback where the source, drain, and substrate of the NMOS transistor form a forward biased N-P-N bipolar junction transistor which conducts current. In embodiments in which BJT circuit 610 functions as ESD block 150, current is conducted to the first power supply voltage terminal, or rail, 110 in response to an ESD pulse of a positive polarity. In embodiments in which BJT circuit 610 functions as ESD block 160, a similar snapback operation takes place in response to an ESD pulse of a negative polarity.

Figure 7:
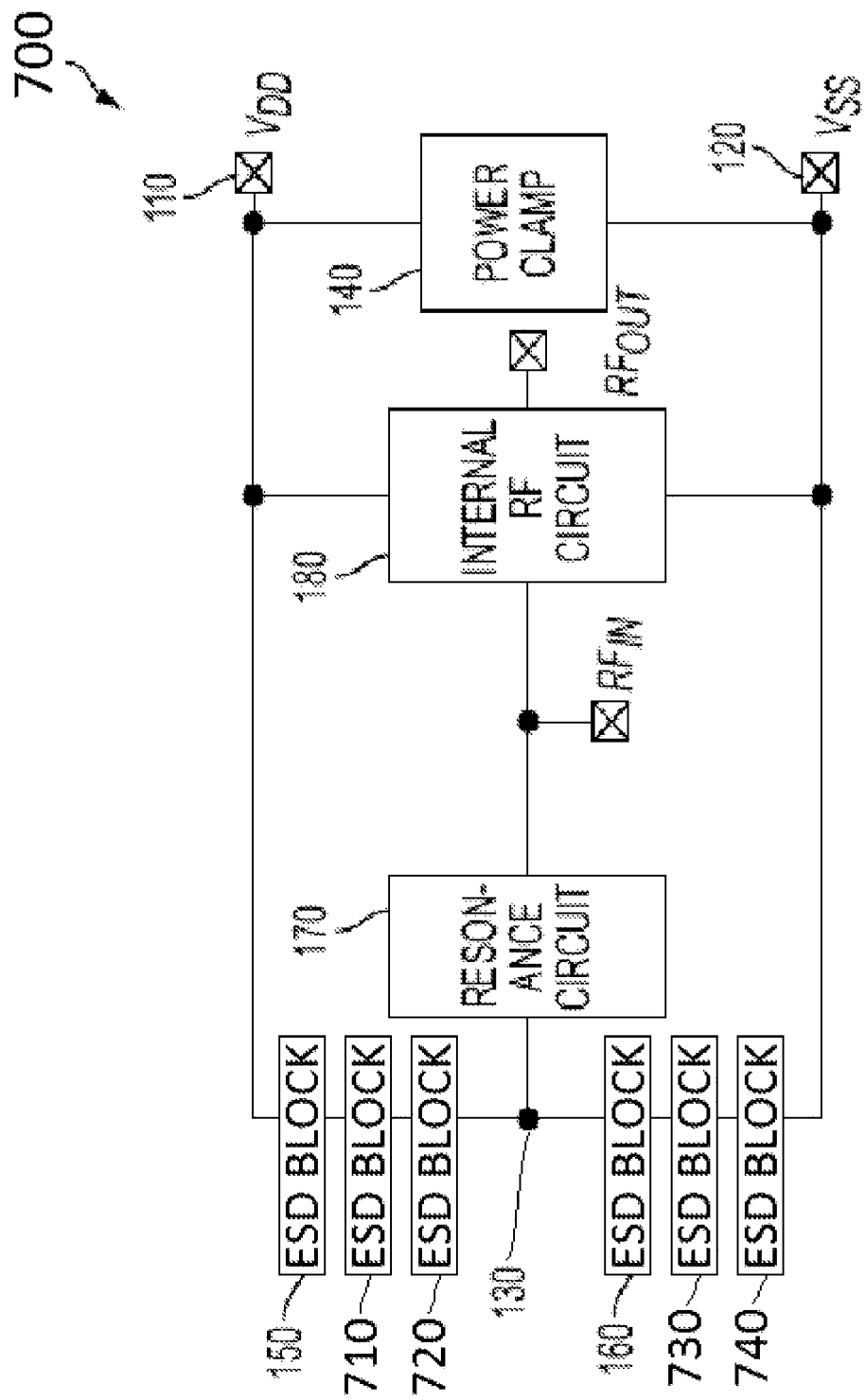
FIG. 7 is a schematic block diagram of an ESD protection circuit in accordance with some embodiments.

FIG. 7 is a schematic circuit diagram of an ESD protection circuit 700 in accordance with some embodiments. ESD protection circuit 700 is similar to ESD protection circuit 100, described with respect to FIG. 1, and further comprises ESD blocks 710, 720, 730, and 740. ESD blocks 710 and 720 are configured in series with ESD block 150, while ESD blocks 730 and 740 are configured in series with ESD block 160. ESD blocks 710 and 720 are configured similarly to ESD block 150, so that, in response to a positive ESD pulse, current flows through ESD blocks 150, 710, and 720 to first power supply voltage terminal, or rail, 110. ESD blocks 730 and 740 are configured similarly to ESD block 160, so that, in response to a negative ESD pulse, current flows through ESD blocks 160, 730, and 740 to the second power supply voltage terminal, or rail, 120.

In some embodiments, ESD blocks 150, 160, 710, 720, 730, and 740 are any element or circuit capable of functioning as an ESD block as described previously with respect to the various embodiments. In various embodiments, any of ESD blocks 150, 160, 710, 720, 730, and 740 are diodes, SCRs, BJT circuits, or combinations thereof. In some embodiments, a series diode configuration including serially coupled diodes reduces the series on-resistance as compared to a single diode, thereby improving ESD performance.

Figure 8:
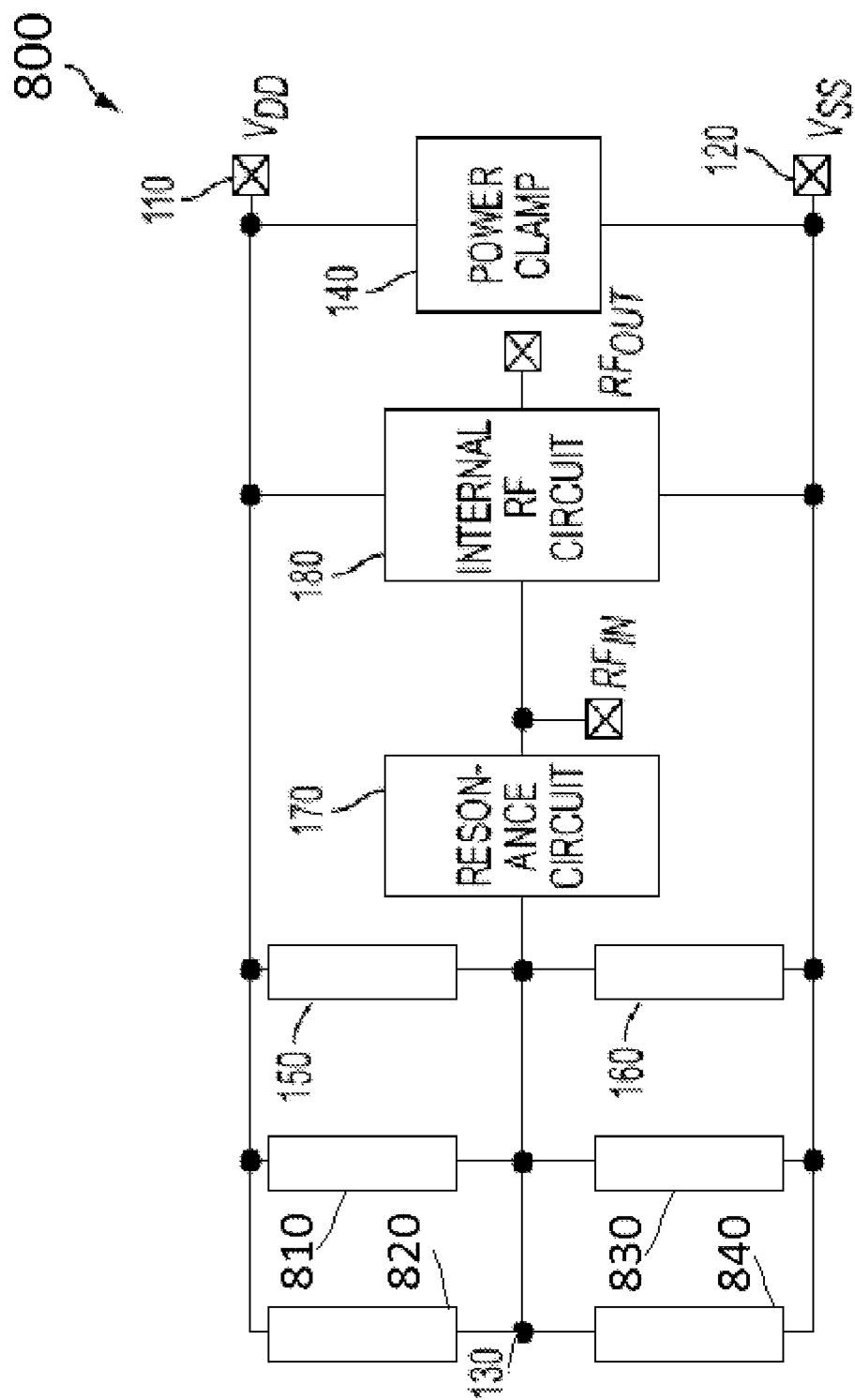
FIG. 8 is a schematic block diagram of an ESD protection circuit in accordance with some embodiments

FIG. 8 is a schematic circuit diagram of an ESD protection circuit 800 in accordance with some embodiments. ESD protection circuit 800 is similar to ESD protection circuit 100, described with respect to FIG. 1, and further comprises ESD blocks 810, 820, 830, and 840. ESD blocks 810 and 820 are configured in parallel with ESD block 150 and have first terminals commonly coupled to node 130 and second terminals commonly coupled to first power supply voltage terminal, or rail, 110. ESD blocks 830 and 840 are configured in parallel with ESD block 160 and have first terminals commonly coupled to second power supply voltage terminal, or rail, 120 and second terminals commonly coupled to node 130. ESD blocks 810 and 820 are configured similarly to ESD block 150, so that, in response to a positive ESD pulse, current flows separately through ESD blocks 150, 810, and 820 to first power supply voltage terminal, or rail, 110. ESD blocks 830 and 840 are configured similarly to ESD block 160, so that, in response to a negative ESD pulse, current flows separately through ESD blocks 160, 830, and 840 to the second power supply voltage terminal, or rail, 120.

In various embodiments, ESD blocks 150, 160, 810, 820, 830, and 840 are any element or circuit capable of functioning as an ESD block as described previously with respect to the various embodiments. In various embodiments, any of ESD blocks 150, 160, 810, 820, 830, and 840 are diodes, SCRs, BJT circuits, or combinations thereof. In some embodiments, a parallel ESD block configuration reduces overall current path resistance as compared to a single ESD block, thereby improving ESD performance.

Figure 9:
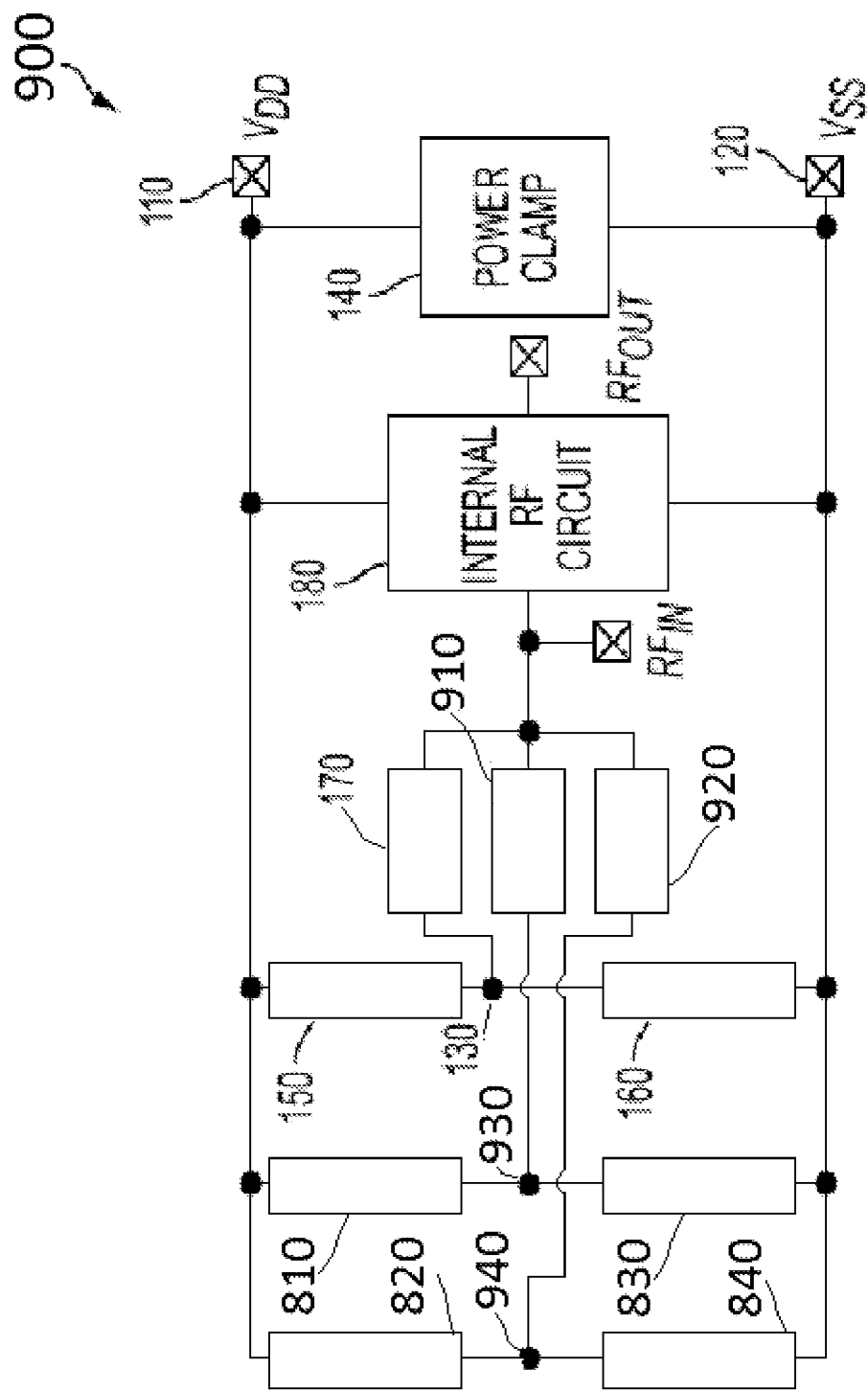
FIG. 9 is a schematic block diagram of an ESD protection circuit in accordance with some embodiments.

FIG. 9 is a schematic circuit diagram of an ESD protection circuit 900 in accordance with some embodiments. ESD protection circuit 900 is similar to ESD protection circuit 800, described with respect to FIG. 8, and further comprises resonance circuits 910 and 920 and nodes 930 and 940. Resonance circuits 170, 910, and 920 have first terminals commonly coupled to RF input pad $RF_{in}$. A second terminal of resonance circuit 170 is coupled to node 130 and ESD blocks 150 and 160, forming first current path to first power supply voltage terminal, or rail, 110 and second current path to second power supply voltage terminal, or rail, 120, respectively. A second terminal of resonance circuit 910 is coupled to node 930 and ESD blocks 810 and 830, forming third current path to first power supply voltage terminal, or rail, 110 and fourth current path to second power supply voltage terminal, or rail, 120, respectively. A second terminal of resonance circuit 920 is coupled to node 940 and ESD blocks 820 and 840, forming fifth current path to first power supply voltage terminal, or rail, 110 and sixth current path to second power supply voltage terminal, or rail, 120, respectively.

Resonance circuits 910 and 920 are similar to resonance circuit 170, described with respect to FIG. 1. Specifically, each of resonance circuits 910 and 920 presents a greater impedance to signals of RF frequencies than to ESD pulses of much lower frequencies. Thus, during normal operation, each of resonance 910 and resonance circuit 920 presents a large impedance to the RF input signal applied to the RF input pad $RF_{in}$. In various embodiments, resonance circuits 170, 910, and 920 are any circuit capable of functioning as a resonance circuit as described previously with respect to the various embodiments. In various embodiments, any of resonance circuits 170, 910, and 920 comprise one or more inductors, capacitors, diodes, resistors, SCRs, BJT circuits, or combinations thereof.

The first, third, and fifth current paths are configured in parallel, with each current path comprising a resonance circuit and an ESD block coupled in series between RF input pad $RF_{in}$ and first power supply voltage terminal, or rail, 110. In response to a positive ESD pulse, current flows separately through each of the first, third, and fifth current paths. The second, forth, and sixth current paths are configured in parallel, with each current path comprising a resonance circuit and an ESD block coupled in series between RF input pad $RF_{in}$ and second power supply voltage terminal, or rail, 120. In response to a negative ESD pulse, current flows separately through each of the second, fourth, and sixth current paths. In some embodiments, a parallel current path configuration reduces path resistance as compared to a single current path configuration, thereby improving ESD performance.

Figure 10:
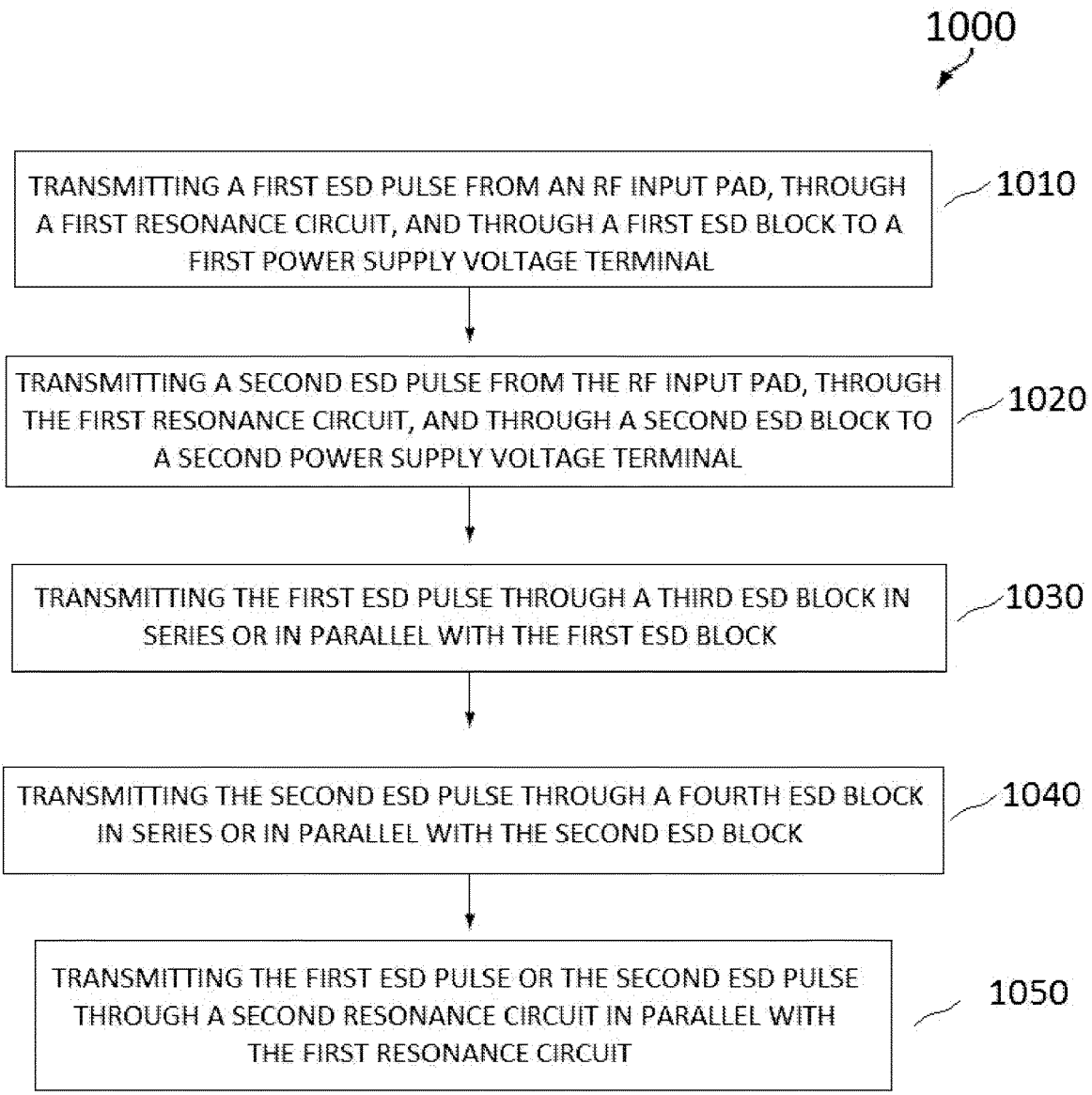
FIG. 10 is a flow chart of an ESD protection method in accordance with some embodiments.

FIG. 10 is a flow chart of an ESD protection method 1000 in accordance with some embodiments. At step 1010, upon occurrence of a first ESD pulse (e.g., 191) of a positive polarity at an RF input pad $RF_{in}$ of the RF semiconductor device, the first ESD pulse is transmitted along a first ESD current path from the RF input pad $RF_{in}$, through a first resonance circuit (e.g., 170), through a first ESD block (e.g., ESD block 150) to a first power supply voltage terminal of the RF semiconductor device.

At step 1020, upon occurrence of a second ESD pulse (e.g., 192) of a negative polarity at the RF input pad $RF_{in}$, the second ESD pulse is transmitted along a second ESD current path from the RF input pad $RF_{in}$, through the resonance circuit (e.g., 170), through a second ESD block (e.g., ESD block 160) to a second power supply voltage terminal of the RF semiconductor device. Thus, the first resonance circuit (e.g., 170) is common to both the first and second ESD current paths.

At step 1030, upon occurrence of the first ESD pulse, the first ESD pulse is further transmitted through a third ESD block (e.g., 710) in series with the first ESD block or (e.g., 810) in parallel with the first ESD block.

At step 1040, upon occurrence of the second ESD pulse, the second ESD pulse is further transmitted through a fourth ESD block (e.g., 730) in series with the second ESD block or (e.g., 830) in parallel with the second ESD block.

At step 1050, the first pulse or the second pulse is further transmitted through a second resonance circuit (e.g., 910) in parallel with the first resonance circuit. In some embodiments, the first pulse is transmitted through both the first ESD current path and a parallel third ESD current path formed by the second resonance circuit (e.g., 910) and the third ESD block (e.g., 810). In some embodiments, the second pulse is transmitted through both the second ESD current path and a parallel fourth ESD current path formed by the second resonance circuit (e.g., 910) and the fourth ESD block (e.g., 830). Thus, the second resonance circuit (e.g., 910) is common to both the third and fourth ESD current paths.

The above method embodiment shows exemplary steps, but they are not necessarily required to be performed in the order shown. Steps may be added, replaced, changed order, and/or eliminated as appropriate, in accordance with the spirit and scope of embodiments of the disclosure. Embodiments that combine different features and/or different embodiments are within scope of the disclosure and will be apparent to those skilled in the art after reviewing this disclosure.

According to some embodiments, an electrostatic discharge (ESD) protection circuit for a radio frequency (RF) circuit comprises a first power supply voltage terminal configured to receive a first power supply voltage, and a second power supply voltage terminal configured to receive a second power supply voltage. A power clamp is coupled between the first and second power supply voltage terminals. An RF input pad is configured to receive an RF input signal having an RF operating frequency for the RF circuit. A resonance circuit is coupled to the RF input pad. A first ESD current path is configured from the RF input pad to the first power supply voltage terminal, the first ESD current path comprising the resonance circuit and a first ESD block, the first ESD block configured to direct an ESD pulse of a first polarity toward the first power supply voltage terminal. A second ESD current path is configured from the RF input pad to the second power supply voltage terminal, the second ESD current path comprising the resonance circuit and a second ESD block, the second ESD block configured to direct an ESD pulse of a second polarity toward the second power supply voltage terminal.

According to some embodiments, an electrostatic discharge (ESD) protection circuit for a radio frequency (RF) circuit comprises a first power supply rail and a second power supply rail. A power clamp is coupled between the first and second power supply rails. An RF input pad is configured to receive an RF input signal having an RF operating frequency for the RF circuit and a first resonance circuit is coupled to the RF input pad. A first ESD current path is configured from the RF input pad to the first power supply rail, the first ESD current path comprising the resonance circuit and a first ESD block. A second ESD current path is configured from the RF input pad to the second power supply rail, the second ESD current path comprising the resonance circuit and a second ESD block. A second resonance circuit is coupled to the RF input pad. A third ESD current path is configured from the RF input pad to the first power supply rail, the third ESD current path comprising the second resonance circuit and a third ESD block. A fourth ESD current path is configured from the RF input pad to the second power supply rail, the fourth ESD current path comprising the second resonance circuit and a fourth ESD block.

According to some embodiments, in a method of protecting a radio frequency (RF) circuit from ESD events, a first ESD pulse is transmitted from an RF input pad of the RF circuit, through a first resonance circuit, and through a first ESD block to a first power supply voltage terminal of the RF circuit responsive to occurrence of the first ESD pulse of a positive polarity at the RF input pad. A second ESD pulse is transmitted from the RF input pad, through the first resonance circuit, and through a second ESD block to a second power supply voltage terminal of the RF circuit responsive to occurrence of the second ESD pulse of a negative polarity at the RF input pad.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An electrostatic discharge (ESD) protection circuit for a radio frequency (RF) circuit, the ESD protection circuit comprising:
   a first power supply voltage terminal configured to receive a first power supply voltage;
   a second power supply voltage terminal configured to receive a second power supply voltage;
   a power clamp coupled between the first power supply voltage terminal and the second power supply voltage terminal;
   an RF input pad configured to receive an RF input signal having an RF operating frequency for the RF circuit;
   a resonance circuit coupled to the RF input pad;
   a first ESD current path from the RF input pad to the first power supply voltage terminal, the first ESD current path comprising the resonance circuit and a first ESD block, the first ESD block configured to direct an ESD pulse of a first polarity toward the first power supply voltage terminal; and a second ESD current path from the RF input pad to the second power supply voltage terminal, the second ESD current path comprising the resonance circuit and a second ESD block, the second ESD block configured to direct an ESD pulse of a second polarity toward the second power supply voltage terminal, wherein the RF circuit is configured to operate at the RF operating frequency independently of the resonance circuit;

the resonance circuit is coupled to the first ESD block and the second ESD block at an intermediate node, and the RF input pad is coupled between the resonance circuit and the RF circuit.

2. The ESD protection circuit of claim 1, wherein at least one of:
the first ESD block comprises a silicon-controlled rectifier (SCR) having an anode coupled to the resonance circuit and a cathode coupled to the first power supply voltage terminal; or
the second ESD block comprises a SCR having an cathode coupled to the resonance circuit and an anode coupled to the second power supply voltage terminal.

3. The ESD protection circuit of claim 1, wherein at least one of:
the first ESD block comprises a bipolar junction transistor (BJT) circuit configured to direct the ESD pulse of the first polarity toward the first power supply voltage terminal; or
the second ESD block comprises a BJT circuit configured to direct the ESD pulse of the second polarity toward the second power supply voltage terminal.

4. The ESD protection circuit of claim 1, wherein at least one of:
the first ESD current path further comprises a third ESD block coupled in series with the first ESD block; or
the second ESD current path further comprises a fourth ESD block coupled in series with the second ESD block.

5. The ESD protection circuit of claim 1, wherein at least one of:
the first ESD current path further comprises a third ESD block coupled in parallel with the first ESD block; or
the second ESD current path further comprises a fourth ESD block coupled in parallel with the second ESD block.

6. The ESD protection circuit of claim 1, wherein at least one of:
the first ESD block comprises a diode configured to direct the ESD pulse of the first polarity toward the first power supply voltage terminal; or
the second ESD block comprises a diode configured to direct the ESD pulse of the second polarity toward the second power supply voltage terminal.

7. The ESD protection circuit of claim 1, further comprising:
a second resonance circuit coupled to the RF input pad;
a third ESD current path from the RF input pad to the first power supply voltage terminal, the third ESD current path comprising the second resonance circuit and a third ESD block, the third ESD block configured to direct the ESD pulse of the first polarity toward the first power supply voltage terminal; and
a fourth ESD current path from the RF input pad to the second power supply voltage terminal, the fourth ESD current path comprising the second resonance circuit and a fourth ESD block, the fourth ESD block configured to direct the ESD pulse of the second polarity toward the second power supply voltage terminal.

8. The ESD protection circuit of claim 1, wherein the resonance circuit comprises an inductor and an element that exhibits a capacitive characteristic at the RF operating frequency.

9. The ESD protection circuit of claim 1, further comprising a resistor coupled in parallel with the resonance circuit.

10. An electrostatic discharge (ESD) protection circuit for a radio frequency (RF) circuit, the ESD protection circuit comprising:
a first power supply rail;
a second power supply rail;
a power clamp coupled between the first power supply rail and the second power supply rail;
an RF input pad for the RF circuit;
a first resonance circuit coupled to the RF input pad, the RF input pad being coupled between the first resonance circuit and the RF circuit;
a first ESD current path from the RF input pad to the first power supply rail, the first ESD current path comprising the first resonance circuit and a first ESD block;
a second ESD current path from the RF input pad to the second power supply rail, the second ESD current path comprising the first resonance circuit and a second ESD block;
a second resonance circuit coupled to the RF input pad;
a third ESD current path from the RF input pad to the first power supply rail, the third ESD current path comprising the second resonance circuit and a third ESD block; and
a fourth ESD current path from the RF input pad to the second power supply rail, the fourth ESD current path comprising the second resonance circuit and a fourth ESD block,
wherein the RF circuit is configured to operate at an RF operating frequency independently of the first resonance circuit and the second resonance circuit.

11. The ESD protection circuit of claim 10, wherein at least one of:
the first ESD block comprises a first diode configured to conduct a positive ESD pulse toward the first power supply rail; or
the second ESD block comprises a second diode configured to conduct a negative ESD pulse toward the second power supply rail.

12. The ESD protection circuit of claim 11, wherein at least one of:
the first ESD current path further comprises a third diode coupled in series with the first diode, the third diode configured to conduct the positive ESD pulse toward the first power supply rail; or
the second ESD current path further comprises a fourth diode coupled in series with the second diode, the fourth diode configured to conduct the negative ESD pulse toward the second power supply rail.

13. The ESD protection circuit of claim 11, wherein at least one of:
the third ESD block comprises a third diode coupled in parallel with the first diode, the third diode configured to conduct the positive ESD pulse toward the first power supply rail; or the fourth ESD block comprises a fourth diode coupled in parallel with the second diode, the fourth diode configured to conduct the negative ESD pulse toward the second power supply rail.

14. The ESD protection circuit of claim 10, wherein at least one of the first resonance circuit or the second resonance circuit has a resonance frequency in a range from 80% to 120% of the RF operating frequency of the RF circuit.

15. The ESD protection circuit of claim 10, wherein at least one of the first resonance circuit or the second resonance circuit comprises an inductor and an element that exhibits a capacitive characteristic at the RF operating frequency of the RF circuit.

16. The ESD protection circuit of claim 10, further comprising a resistor coupled in parallel with at least one of the first resonance circuit or the second resonance circuit.

17. A method of protecting a radio frequency (RF) circuit from electrostatic discharge (ESD) events, said method comprising:
  transmitting a first ESD pulse from an RF input pad of the RF circuit, through a first resonance circuit, and through a first ESD block to a first power supply voltage terminal of the RF circuit responsive to occurrence of the first ESD pulse of a positive polarity at the RF input pad; and
  transmitting a second ESD pulse from the RF input pad, through the first resonance circuit, and through a second ESD block to a second power supply voltage terminal of the RF circuit responsive to occurrence of the second ESD pulse of a negative polarity at the RF input pad,
wherein
  the RF circuit is configured to operate at an RF operating frequency independently of the first resonance circuit;
  the first resonance circuit is coupled to the first ESD block and the second ESD block at an intermediate node, and
  the RF input pad is coupled between the first resonance circuit and the RF circuit.

18. The method of claim 17, further comprising at least one of:
  transmitting the first ESD pulse through a third ESD block coupled in series with the first ESD block responsive to occurrence of the first ESD pulse; or
  transmitting the second ESD pulse through a fourth ESD block coupled in series with the second ESD block responsive to occurrence of the second ESD pulse.

19. The method of claim 17, further comprising at least one of:
  transmitting the first ESD pulse through a third ESD block coupled in parallel with the first ESD block responsive to occurrence of the first ESD pulse; or
  transmitting the second ESD pulse through a fourth ESD block coupled in parallel with the second ESD block responsive to occurrence of the second ESD pulse.

20. The method of claim 17, further comprising transmitting at least one of the first ESD pulse or the second ESD pulse through a second resonance circuit to the first power supply voltage terminal or the second power supply voltage terminal of the RF circuit.

* * * * *